United States Patent
Peyrot et al.

(10) Patent No.: US 10,951,180 B2
(45) Date of Patent: Mar. 16, 2021

(54) RF POWER TRANSISTORS WITH IMPEDANCE MATCHING CIRCUITS, AND METHODS OF MANUFACTURE THEREOF

(71) Applicant: NXP USA, Inc., Austin, TX (US)

(72) Inventors: Pascal Peyrot, Frouzins (FR); Olivier Lembeye, Saint Lys (FR); Enver Krvavac, Kildeer, IL (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/211,485

(22) Filed: Dec. 6, 2018

(65) Prior Publication Data
US 2019/0190464 A1 Jun. 20, 2019

(30) Foreign Application Priority Data

Dec. 20, 2017 (EP) ..................... 17306857

(51) Int. Cl.
  *H03F 1/56* (2006.01)
  *H01L 23/66* (2006.01)
  (Continued)

(52) U.S. Cl.
  CPC ............ *H03F 1/565* (2013.01); *H01L 23/66* (2013.01); *H01L 24/48* (2013.01); *H01L 24/49* (2013.01);
  (Continued)

(58) Field of Classification Search
  CPC .......... H03F 1/565; H03F 3/193; H03F 3/195; H01L 23/66; H01L 24/48; H01L 24/49
  See application file for complete search history.

(56) References Cited

U.S. PATENT DOCUMENTS 7,119,623 B2  10/2006  Blednov et al.
9,531,328 B2  12/2016  Frei et al.
(Continued)

FOREIGN PATENT DOCUMENTS

EP  1748487       1/2007
EP  3096353 A1   11/2016
WO  WO-2019/104325 A1  5/2019

OTHER PUBLICATIONS

Chéron, J. et al. "Wideband harmonically matched packaged GaN HEMTs with high PAE performances at S-band requencies", International Journal of Microwave and Wireless Technologies, vol. 5, Issue 4, pp. 437-445 (Aug. 2013).
(Continued)

*Primary Examiner* — Samuel S Outten
(74) *Attorney, Agent, or Firm* — Sherry W. Schumm

(57) ABSTRACT

Embodiments of an RF amplifier include a transistor with a control terminal and first and second current carrying terminals, and a shunt circuit coupled between the first current carrying terminal and a ground reference node. The shunt circuit is an output pre-match impedance conditioning shunt circuit, which includes a first shunt inductance, a second shunt inductance, and a shunt capacitor coupled in series. The first shunt inductance comprises a plurality of bondwires coupled between the first current carrying terminal and the second shunt inductance, and the second shunt inductance comprises an integrated inductor coupled between the first shunt inductance and a first terminal of the shunt capacitor. The shunt capacitor is configured to provide capacitive harmonic control of an output of the transistor.

12 Claims, 8 Drawing Sheets

(51) Int. Cl.
*H01L 23/00* (2006.01)
*H03F 3/193* (2006.01)
*H03F 3/195* (2006.01)

(52) U.S. Cl.
CPC ............. *H03F 3/193* (2013.01); *H03F 3/195* (2013.01); *H01L 2223/6655* (2013.01); *H01L 2224/48091* (2013.01); *H01L 2224/49175* (2013.01); *H01L 2924/1205* (2013.01); *H01L 2924/1206* (2013.01); *H01L 2924/1304* (2013.01); *H01L 2924/13091* (2013.01); *H01L 2924/1421* (2013.01); *H03F 2200/216* (2013.01); *H03F 2200/222* (2013.01); *H03F 2200/225* (2013.01); *H03F 2200/297* (2013.01); *H03F 2200/301* (2013.01); *H03F 2200/309* (2013.01); *H03F 2200/387* (2013.01); *H03F 2200/391* (2013.01); *H03F 2200/451* (2013.01)

(56) References Cited

U.S. PATENT DOCUMENTS

| | | |
|---|---|---|
| 9,571,044 B1 | 2/2017 | Zhu et al. |
| 9,692,363 B2 | 6/2017 | Zhu et al. |
| 2015/0235933 A1 | 8/2015 | Ladhani et al. |
| 2016/0173039 A1* | 6/2016 | Frei .......... H03F 3/193 330/251 |
| 2016/0344353 A1* | 11/2016 | Watts ............. H01G 4/005 |
| 2019/0165753 A1* | 5/2019 | Arigong ............. H03F 1/0222 |

OTHER PUBLICATIONS

Lembeye, O. et al. "100W Easy to Use RR Transistor for Cellular Applications At 900MHz", Motorola Semiconducteurs S.A.S., www.microwavejournal.com/articles/3633-100-w-rf-transistor-for-900-mhz-cellular-applications, pp. 1-5 (Apr. 2003).

\* cited by examiner

RF POWER TRANSISTORS WITH IMPEDANCE MATCHING CIRCUITS, AND METHODS OF MANUFACTURE THEREOF

CROSS-REFERENCE TO RELATED APPLICATIONS

This application claims priority under 35 U.S.C. § 119 to European Patent Application No. 17306857.8, filed on Dec. 20, 2017, the contents of which are incorporated by reference herein.

TECHNICAL FIELD

Embodiments of the subject matter described herein relate generally to packaged semiconductor devices, and more particularly to packaged, radio frequency (RF) semiconductor devices that include impedance matching circuits.

BACKGROUND

A typical high power, radio frequency (RF) semiconductor device may include one or more input leads, one or more output leads, one or more transistors, bondwires coupling the input lead(s) to the transistor(s), and bondwires coupling the transistor(s) to the output lead(s). The bondwires have significant inductive reactance at high frequencies, and such inductances are factored into the design of input and output impedance matching circuits for a device. In some cases, input and output impedance matching circuits may be contained within the same package that contains the device's transistor(s). More specifically, an in-package, input impedance matching circuit may be coupled between a device's input lead and a control terminal (e.g., the gate) of a transistor, and an in-package, output impedance matching circuit may be coupled between a current conducting terminal (e.g., the drain) of a transistor and a device's output lead.

Packaged RF semiconductor devices are available that have decent performance when used in relatively narrow-band applications with relatively low instantaneous signal bandwidth (ISBW) (e.g., ISBW of 150 megahertz (MHz) or less). However, increased ISBW (e.g., ISBW of 200 MHz or more) is becoming a major requirement for RF communication amplifiers (e.g., RF communication infrastructure amplifiers). This requirement stems from the fact that larger information download rates per second are becoming a significant enablement feature. Thus, trends in the RF communication industry include development of packaged RF semiconductor devices with increasingly wideband operation and relatively high ISBW.

Designing RF amplifier devices with high ISBW is challenging. For example, the ISBW of a device may be directly affected by the low frequency resonance (LFR) caused by interaction between the device's bias feeds and output circuits that are electrically connected between a device's transistor(s) and its output lead(s). More particularly, inductances of bondwires that interconnect various output circuit components may limit the LFR of the device.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 9:
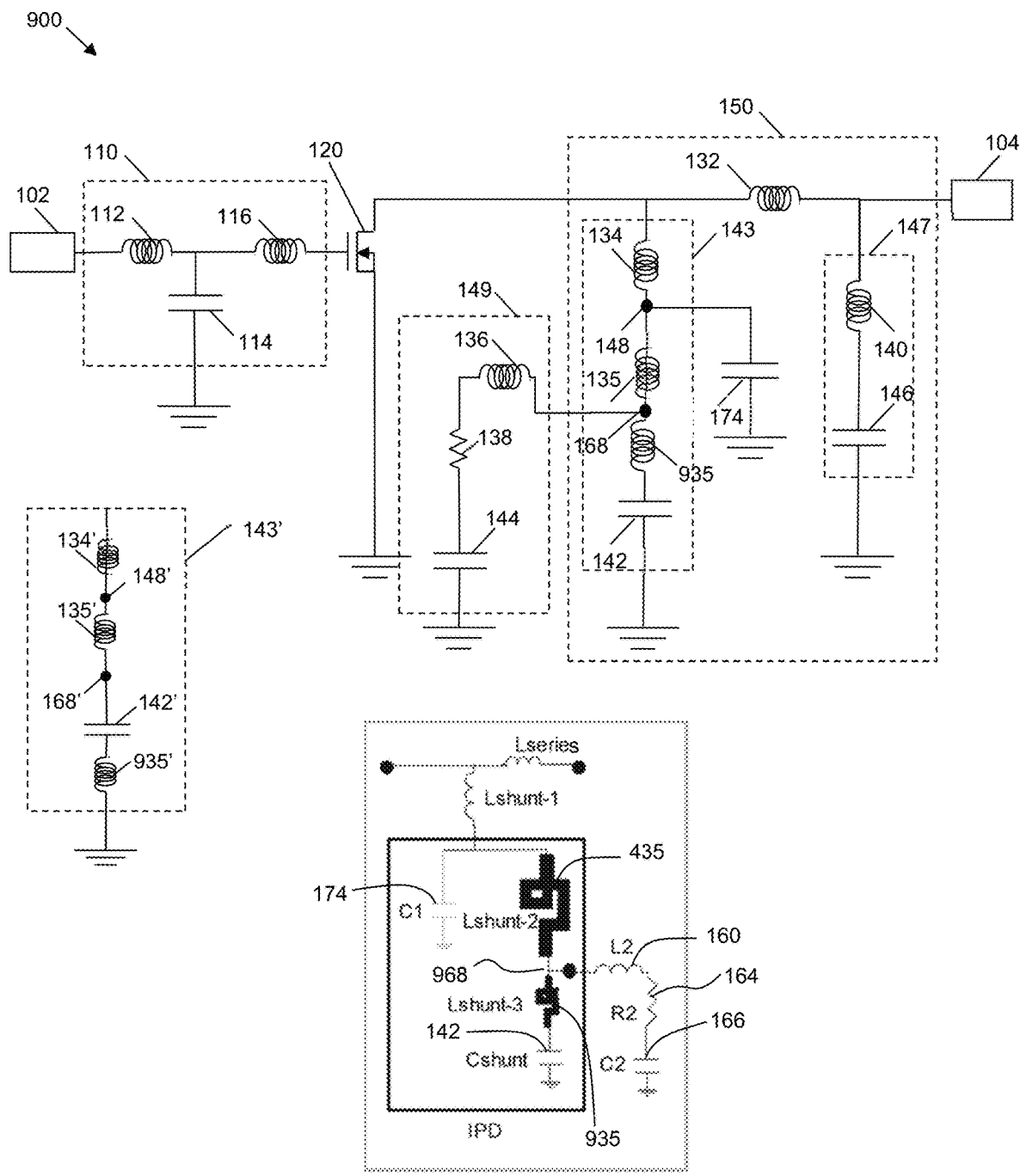
FIG. 9 is a schematic diagram of an RF amplifier with input and output impedance matching and envelope frequency termination circuits, in accordance with another example embodiment.
Figure 10:
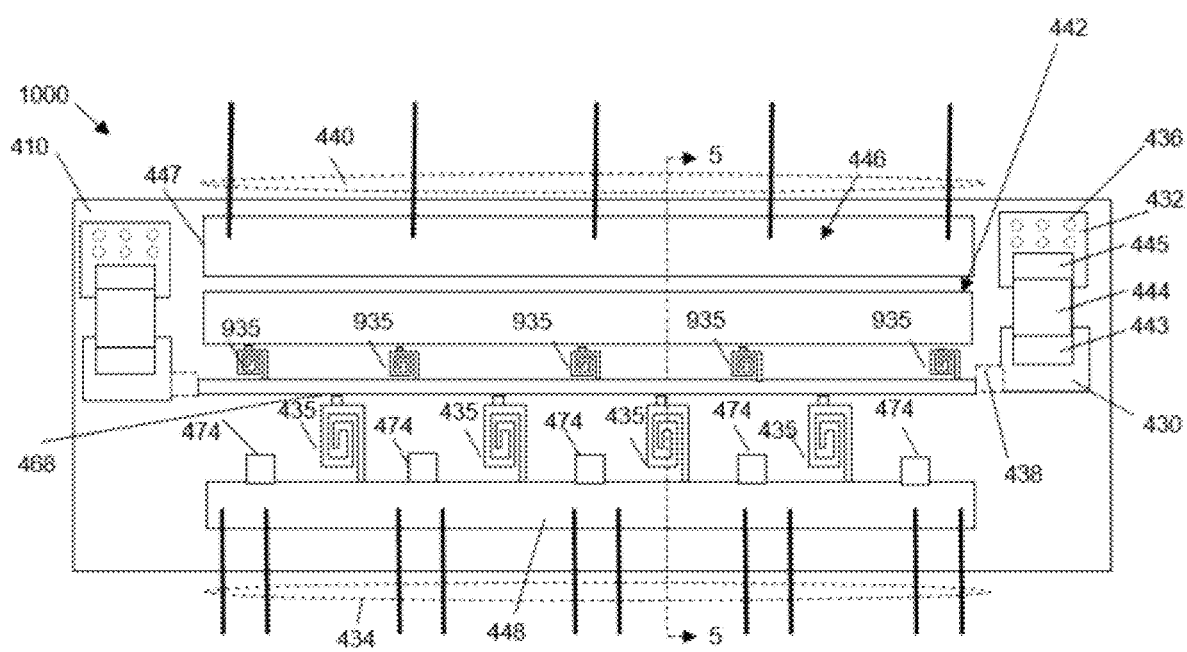
FIG. 10 is a top view of an IPD assembly that includes a portion of an output impedance matching circuit and an envelope frequency termination circuit, in accordance with the example embodiment of FIG. 9.

FIG. 10 is a top view of an IPD assembly that includes a portion of an output impedance matching circuit and an envelope frequency termination circuit, in accordance with the example embodiment of FIG. 9.

An output impedance matching circuit in a conventional RF power amplifier device may include, among other things, a shunt circuit that functions as a high-pass matching stage. For example, a conventional shunt circuit may include an inductor (herein "shunt inductor" or $L_{shunt}$) and a capacitor (herein "shunt capacitor" or $C_{shunt}$) coupled in series between a current conducting terminal (e.g., the drain) of the transistor and a ground reference node. In a conventional device, an "RF cold point" is located between the shunt inductor and the shunt capacitor. Essentially, the RF cold point is a node that may function as a virtual ground reference voltage for RF electrical signals.

Gallium Nitride (GaN)-based amplifiers have been introduced for cellular macro base stations in order to increase efficiency and operating bandwidth. A GaN transistor provides several benefits over a Silicon-based laterally diffused metal oxide semiconductor (Si-LDMOS) transistor as a high-power final amplifier. For example, a GaN transistor may have 10× higher power density when compared with a Si-LDMOS transistor. However, a tradeoff to the significantly increased higher power density is that a GaN transistor compensates for a low drain-source capacitance ($C_{ds}$), which generates several design challenges.

A first design challenge is that for a given frequency (Fo), a low $C_{ds}$ capacitance requires a large output shunt inductance ($L_{shunt}$), in order to compensate its imaginary part, as clarified in equations [1] and [2]:

$$Fo = 1/(2*\pi*\sqrt{Lshunt*Cds}) \quad [1]$$

$$L\text{shunt}=1/(4*\pi^2*Fo^2*Cds) \quad [2].$$

Example embodiments of the present invention provide low $C_{ds}$ capacitance imaginary part compensation, due to an implementation that uses a large-value printed coil (inductance).

Figure 4:
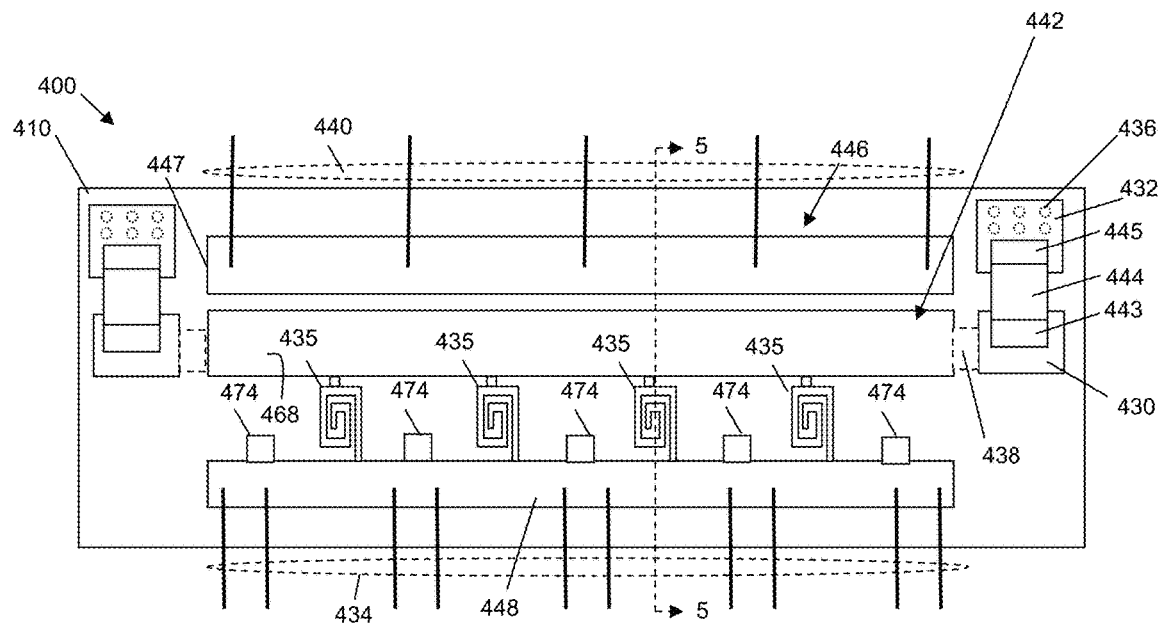
FIG. 4 is a top view of an Integrated Passive Device (IPD) assembly that includes a portion of an output impedance matching circuit and an envelope frequency termination circuit, in accordance with an example embodiment of FIG. 1.

A second design challenge to be addressed is the large output inductance thermal management. Example embodiments of the present invention aim to address this challenge with a novel approach to the implementation of the shunt inductance, by splitting the inductance across both a wire array inductance and one or more integrated passive device (IPD) printed coils, as illustrated in FIGS. 4 and 10. Advantageously, the splitting of the provision of the shunt inductance across both a wire array inductance and one or more IPD printed coils, creates an intermediate point, which may provide a thermal path to cool down the wire temperature.

In some implementations, a third design challenge that needs to be addressed is harmonic control for harmonic loading sensitive technology. Example embodiments of the present invention aim to address this challenge with an introduction of an additional intermediate shunt capacitance (e.g., capacitance 174 or C1, illustrated in FIG. 1), which is optimized to control the output harmonic loading. A lower additional intermediate capacitance value (e.g., capacitance 174) (e.g., of an order of <10% of $C_{ds}$) than the value used to short circuit the $2^{nd}$ harmonic is selected to maintain the compensation bandwidth at the fundamental frequency.

Furthermore, a fourth design challenge is encountered with a use of video bandwidth circuits. In order to improve a low frequency resonance (LFR) of a device, and thus to increase the device's instantaneous signal bandwidth (ISBW), a device also may include an "envelope frequency termination circuit" (or "video bandwidth circuit") in the output impedance matching circuit. Essentially, a properly designed video bandwidth circuit is configured to have low impedance at envelope frequencies, so that the envelope current may readily pass through the video bandwidth circuit to ground, rather than being conveyed to the device's output lead. In a conventional device, the video bandwidth circuit is electrically coupled to the RF cold point (e.g., to a node between the shunt inductance and capacitance) so that the video bandwidth circuit is likely to be exposed only to a minimal amount of RF energy near the center operating frequency.

Figure 1:
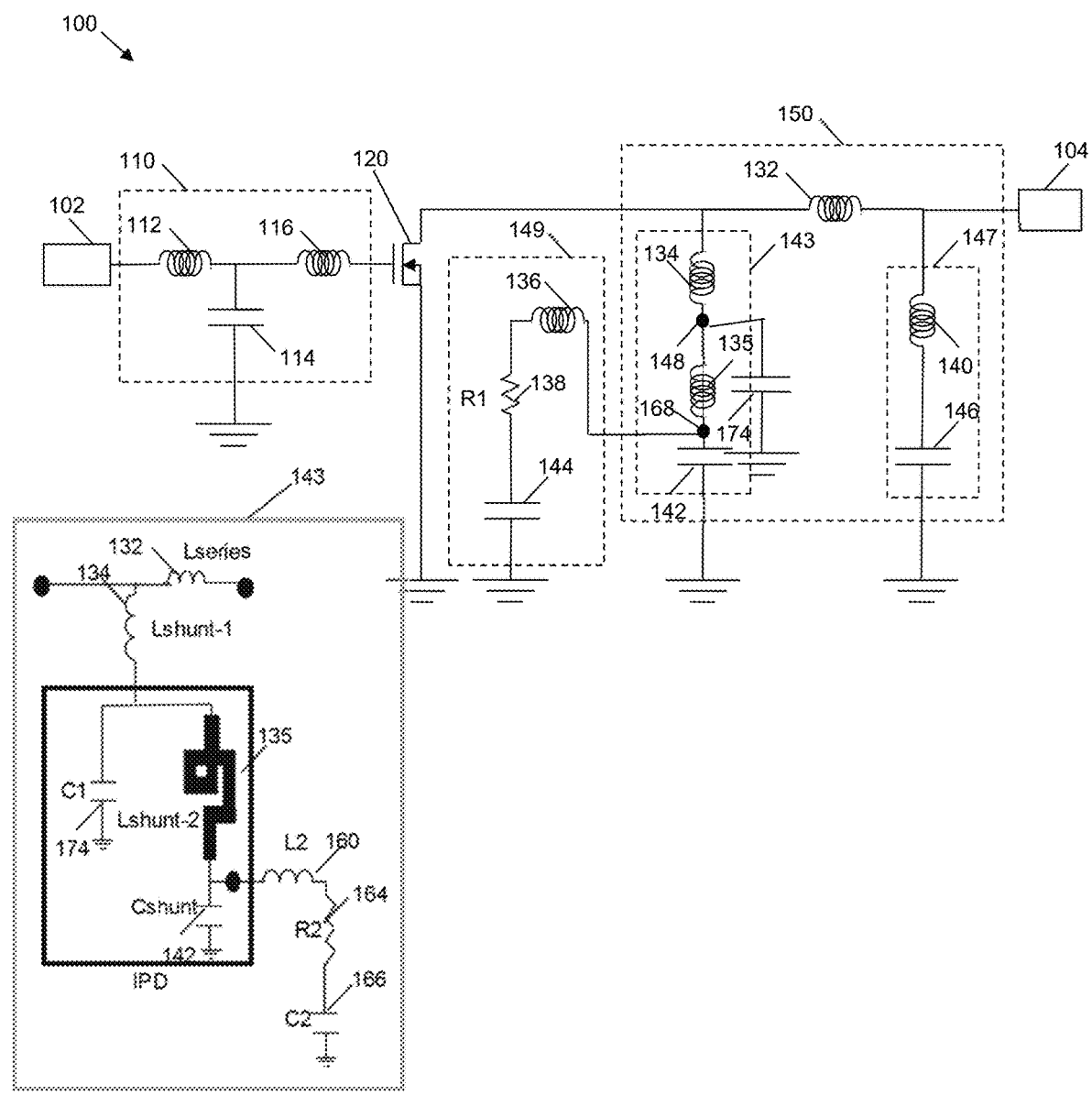
FIG. 1 is a schematic diagram of an RF amplifier with input and output impedance matching and envelope frequency termination circuits, in accordance with an example embodiment.

Example embodiments of the present invention provide a low frequency decoupling circuit that uses a high-value capacitance (HiC), as illustrated in FIG. 1, with capacitance 144 or capacitance (C2) 166 connected through resistor (R2) 164 and wire inductance (L2) 160 or resistor (R1) 138 and wire inductance 136 to the RF cold point 168 created by the $C_{shunt}$ capacitance 142. In other example embodiments, wire inductance 160 or wire inductance 136 may be implemented as a printed inductor on an IPD.

Embodiments of the inventive subject matter include RF amplifiers and packaged semiconductor devices (e.g., packaged RF power transistor devices) that are configured to include a more ideal RF cold point than a conventional device, namely through a printed coil arrangement that is split between shunt inductance 135 and RF cold point improvement inductance 935 as illustrated in FIG. 9. In other words, embodiments of RF amplifiers and devices include an RF cold point at which significantly less RF energy at the center operating frequency is present during operation, when compared with the RF energy that may be present at the RF cold point in a conventional RF amplifier or device. In addition, embodiments include a video bandwidth circuit that is connected to such a "more ideal" RF cold point.

With the RF cold point of the various embodiments, the video bandwidth circuit design is not constrained to have to block significant amounts of RF energy near the center operating frequency, and thus may be designed with a relatively small envelope inductor while still achieving a relatively low baseband impedance (e.g., 1.0 ohm or less up to the LFR of the device). Without significant RF energy at the more ideal RF cold point, the device may avoid a drain efficiency performance penalty due to undesirable RF power dissipation in the envelope resistor. More specifically, with minimal RF energy present at the RF cold point, less power may be dissipated through the envelope resistor.

According to an embodiment, the RF cold point is improved by dividing the shunt inductance into three inductances (Lshunt-1, Lshunt-2, and Lshunt-3, as illustrated in FIG. 9), e.g. wire array 134, printed coil 135 and RF cold point improvement inductance 935 (which in some examples may be implemented as a printed coil). More specifically, the shunt inductance is achieved using a combination of wire array and an output IPD with printed coils and optimized capacitive harmonic control. An RF cold point is also provided to connect a video bandwidth (decoupling) circuit.

With less RF energy present at the new RF cold point, the video bandwidth circuit may be designed with a relatively low envelope inductance, and thus reduced baseband impedance up to the LFR. Further, less RF current flowing through the envelope resistor 138 may translate into improved drain efficiency and a reduced potential for compromising the envelope resistor due to excessive power dissipation.

In accordance with example embodiments of the invention, an output pre-match impedance conditioning circuit for a high-power radio frequency power amplifier is described, wherein the output pre-match impedance conditioning circuit comprises a compensation (shunt) inductance having a first portion that comprises a wire bond array and a second portion located on an IPD and realized with at least one printed coil, for example using printed coils on a high resistivity IPD.

Example embodiments of the invention find particular applicability in an inverted Doherty amplifier architecture, where there is a 90° phase shift on a carrier output pre-match, which thus far has not yet been considered as a viable option in an inverted Doherty amplifier that includes a final-stage GaN transistor.

Although example embodiments of the invention are described with reference to a GaN transistor device, it is envisaged in other example embodiments that the concepts described herein may be used with other technologies, such as LDMOS.

In accordance with example embodiments of the invention, the high-power radio frequency power amplifier may be a GaN-based amplifier that uses an output pre-match impedance conditioning circuit. A GaN-based amplifier with the output pre-match impedance conditioning circuit as described herein compensates for a low output capacitance ($C_{ds}$) with large inductance realization.

The output compensation shunt inductance realization may assist with thermal management and is achieved by the output inductance being split into two or more series-connected inductances, including at least a first wire array compensation shunt inductance and a second IPD printed coil compensation shunt inductance, with an IPD bond pad between the wire array inductance and the IPD inductance.

The IPD bond pad intermediate point provides a thermal path to cool down the wire temperature. In accordance with example embodiments of the invention, the high-power radio frequency power amplifier has broader bandwidth (due to $C_{ds}$ compensation by a $L_{shunt}$, which is traditionally not used for GaN due to the inherently low $C_{ds}$) and improved harmonic control.

In this manner, examples describe a high power, discrete-style GaN transistor, which uses a combination of a wire bond array and an IPD as an output pre-match impedance conditioner, suitable for high efficiency broadband Doherty amplifier applications.

In some example embodiments, the IPD bond pad intermediate point provides a thermal cooling path for the wire bond array, due to the distributed nature of the compensation shunt inductance. The IPD bond pad also enables a connection to a shunt capacitor for $2^{nd}$ or $3^{rd}$ order harmonic frequency control.

In some example embodiments, an additional intermediate capacitance may be used to optimize and control output harmonic loading. A lower capacitance value than the value used to short circuit the $2^{nd}$ harmonic is selected to maintain the compensation bandwidth at the fundamental frequency.

In some example embodiments, an RF cold point is provided in order to enable a low frequency video decoupling circuit implementation, such as a high capacitance connected thru a wire inductance to the RF cold point created on the IPD by the $C_{shunt}$ capacitance.

FIG. 1 is a schematic diagram of an RF power amplifier device 100. Device 100 includes an input lead 102, an input impedance matching circuit 110, a transistor 120, a video bandwidth circuit 149, an output impedance matching circuit 150, and an output lead 104, in an embodiment. The video bandwidth circuit 149 and the output impedance matching circuit 150 may be referred to collectively as an "output circuit." Although transistor 120 and various elements of the input and output impedance matching circuits 110, 150 and the video bandwidth circuit 149 are shown as singular components, the depiction is for the purpose of ease of explanation only. Those of skill in the art would understand, based on the description herein, that transistor 120 and/or certain elements of the input and output impedance matching circuits 110, 150 and the video bandwidth circuit 149 each may be implemented as multiple components (e.g., connected in parallel or in series with each other), and examples of such embodiments are illustrated in the other Figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 120 and various elements of the input and output impedance matching circuits 110, 150 and the video bandwidth circuit 149, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically positioned to span between the exterior and the interior of the device's package. Input impedance matching circuit 110 is electrically coupled between the input lead 102 and a first terminal of transistor 120 (e.g., the gate), which is also located within the device's interior. Similarly, output impedance matching circuit 150 and video bandwidth circuit 149 are electrically coupled between a second terminal of transistor 120 (e.g., the drain) and the output lead 104.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)), which includes a gate (control terminal), a drain (a first current conducting terminal), and a source (a second current conducting terminal). For example, transistor 120 may include a Gallium Nitride high electron mobility transistor (HEMT) or a Silicon laterally diffused MOSFET (LDMOS). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 150 and the video bandwidth circuit 149, and the source of transistor 120 is coupled to ground (or another voltage reference). Through the variation of control signals provided to the gate of transistor 120, the current between the current conducting terminals of transistor 120 may be modulated.

Input impedance matching circuit 110 is coupled between the input lead 102 and the control terminal (e.g., gate) of the transistor 120. Input impedance matching circuit 110 is configured to raise the impedance of device 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface).

According to an embodiment, input impedance matching circuit 110 includes two inductive elements 112, 116 (e.g., two sets of bondwires) and a shunt capacitor 114. A first inductive element 112 (e.g., a first set of bondwires) is coupled between input lead 102 and a first terminal of capacitor 114, and a second inductive element 116 (e.g., a second set of bondwires) is coupled between the first terminal of capacitor 114 and the control terminal of transistor 120. The second terminal of capacitor 114 is coupled to ground (or another voltage reference). The combination of inductive elements 112, 116 and shunt capacitor 114 functions as a low-pass filter. According to an embodiment, the series combination of inductive elements 112, 116 may have a value in a range between about 50 picohenries (pH) to about 3 nanohenries (nH), and shunt capacitor 114 may have a value in a range between about 5 picofarads (pF) to about 80 pF.

Output impedance matching circuit 150 is coupled between the first current conducting terminal (e.g., drain) of transistor 120 and the output lead 104. Output impedance matching circuit 150 is configured to match the output impedance of device 100 with the input impedance of an external circuit or component (not shown) that may be coupled to output lead 104. According to an embodiment, output impedance matching circuit 150 includes four inductive elements 132, 134, 135, 140 and three capacitors 142, 146, 174. Capacitor 174 may be referred to as Cshunt, herein. A first inductive element 132 (e.g., a third set of bondwires), which may be referred to herein as a "series inductor" or $L_{series}$, is coupled between the first current conducting terminal (e.g., drain) of transistor 120 and the output lead 104. A second inductive element 134 (e.g., a fourth set of bondwires, an integrated inductor, or another inductive structure), which may be referred to herein as a "first shunt inductor" or $L_{shunt1}$, is coupled between the first current conducting terminal of transistor 120 and intermediate node 148 in an embodiment. A third inductive element 135 is implemented as an integrated inductor, which may be referred to herein as a "second shunt inductor" or $L_{shunt2}$, is coupled between the intermediate node 148 and a first terminal of a first capacitor 142, which may be referred to herein as a "shunt capacitor".

Finally, a fourth inductive element 140 (e.g., a fifth or sixth set of bondwires), which may be referred to herein as an "low-pass matching inductor," may be used in a GaN implementation and may be coupled between the output lead 104 and a first terminal of a second capacitor 146, which may be referred to herein as an "low-pass matching capacitor." Second terminals of the shunt and low-pass matching capacitors 142, 146, 174 are coupled to ground (or to another voltage reference), in an embodiment.

In the illustrated embodiment, the wire inductance 134 is not dominant over inductance 135 in the context of the overall shunt inductance. Wire inductance 134 provides a connection inductance to the IPD and as such the IPD integrated shunt inductance 135 is considered to be the main matching inductance. In some examples, a split between the inductance values of wire inductance 134 and integrated shunt inductance 135 may be within the range of: 50%:50% to 10%:90%. Large values for integrated shunt inductance 135 may be achieved because it is printed, or formed from portion(s) of one or more patterned conductive layers of the IPD. In some example embodiments, it is noteworthy that the heat is dissipated to the substrate on which the IPD is mounted (e.g., a package flange, which functions as a heatsink) through the IPD body.

The first and second shunt inductors 134, 135 and the shunt capacitor 142 are coupled in series between a current conducting terminal of transistor 120 and a ground reference node, and this combination of impedance matching elements functions as a first (high-pass) matching stage. Accordingly, the combination of shunt inductors 134, 135 and shunt capacitor 142 may be referred to herein as a high-pass matching circuit 143, and also herein referred to as an output pre-match impedance conditioning shunt circuit. According to an embodiment, the series combination of shunt inductors 134, 135 may have a value in a range between about 100 pH to about 3 nH, and shunt capacitor 142 may have a value in a range between about 50 pF to about 500 pF, although these components may have values outside of these ranges, as well.

In some examples, an RF cold point 168 is present at the node between the second shunt inductor 135 and shunt capacitor 142. As discussed previously, the RF cold point 168 represents a low impedance point in the circuit for RF signals. As will be described in more detail later in conjunction with FIGS. 2-10, various embodiments of RF amplifier devices may include at least one integrated passive device (IPD) assembly (e.g., IPD assembly 400, 1000, FIG. 4, FIG. 10), which includes portions of the output circuit. More specifically, each IPD assembly may include a semiconductor substrate with one or more integrated passive components. In a particular embodiment, each IPD assembly may include second shunt inductor 135, RF cold point 168, shunt capacitor 142, and portions of video bandwidth circuit 149. In other embodiments, some or all of these portions of the output impedance matching circuit 150 and video bandwidth circuit 149 may be implemented as distinct/discrete components or as portions of other types of assemblies (e.g., a low-temperature co-fired ceramic (LTCC) device, a small PCB assembly, and so on). In still other embodiments, some or all of these portions of the output impedance matching circuit 150 and video bandwidth circuit 149 may be coupled to and/or integrated within the semiconductor die that includes transistor 120. The below, detailed description of embodiments that include IPD assemblies should not be taken to limit the inventive subject matter, and the term "passive device substrate" means any type of structure that includes a passive device, including an IPD, a LTCC device, a transistor die, a PCB assembly, and so on.

Video bandwidth circuit 149 is coupled between the RF cold point 168 and ground (or another voltage reference). Video bandwidth circuit 149 functions to improve the LFR of device 100 caused by the interaction between the output impedance matching circuit 150 and the bias feeds (not shown) by presenting a low impedance at envelope frequencies and a high impedance at RF frequencies. Video bandwidth circuit 149 essentially is "invisible" from an RF matching standpoint, as it only effects the output impedance at envelope frequencies (i.e., video bandwidth circuit 149 provides terminations for the envelope frequencies of device 100).

According to an embodiment, video bandwidth circuit 149 includes an inductance 136, a resistor 138, and a capacitor 144 coupled in series. According to an embodiment, the inductance 136, $L_{env}$, may be implemented as a set of bondwires coupling RF cold point 168 to the envelope resistor 138, $R_{env}$. In such an embodiment, envelope inductance 136 may have a value in a range between about 5 pH to about 2000 pH. In another embodiment, which will be discussed in more detail in conjunction with FIGS. 2-10, the envelope inductance 136 may be accomplished without bondwire connections between the RF cold point 168 and the other components of the video bandwidth circuit 149 (e.g., resistor 138 and capacitor 144). More particularly, other embodiments of RF amplifier devices also may incorporate the envelope inductance 136, the envelope resistor 138, and the envelope capacitor 144 into the aforementioned embodiments of IPD assemblies (e.g., IPD assembly 400, 1000 of FIG. 4, FIG. 10), or into the die that includes transistor 120. Within an IPD assembly (or within the transistor die), the video bandwidth circuit 149 components may be coupled together and to ground (or another voltage reference) with connections having very low and tightly controlled inductance. Tight control of the envelope inductance 136 is achieved, according to various embodiments, by connecting the envelope resistor 138 and envelope capacitor 144 to the RF cold point 168 (e.g., RF cold point node 468, FIG. 4) through photolithographically formed connections within the IPD assembly (e.g., conductive traces and vias), rather than through bondwires. The IPD assemblies of the various embodiments may substantially reduce and control the inductance value of envelope inductance 136, thus reducing the total inductance included in the video bandwidth circuit 149. This may have the effect of improving both the LFR and ISBW of the device 100.

Low-pass matching inductor 140 and low-pass matching capacitor 146 are coupled in series between the output lead 104 and ground (or another voltage reference), and this combination of impedance matching elements functions as a second (low-pass) matching stage. Accordingly, the combination of low-pass matching inductor 140 and low-pass matching capacitor 146 may be referred to herein as a low-pass matching circuit 147. According to an embodiment, low-pass matching inductor 140 may have a value in a range between about 50 pH to about 1 nH, and low-pass matching capacitor 146 may have a value in a range between about 1 pF to about 50 pF, although these components may have values outside of these ranges, as well. According to an alternate embodiment, low pass matching circuit 147 may be excluded altogether from device 100.

Figure 2:
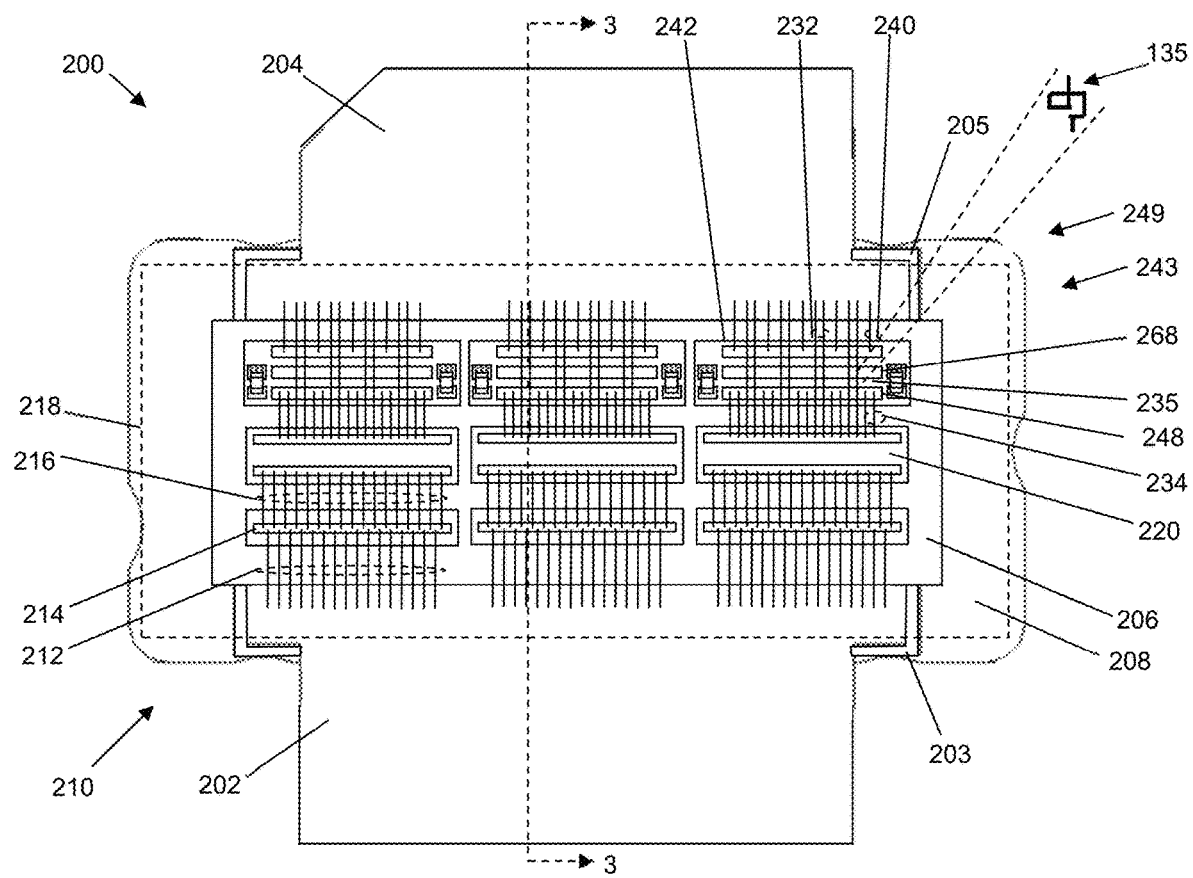
FIG. 2 is a top view of an example of a packaged RF amplifier device that embodies the circuit of FIG. 1, in accordance with an example embodiment.

FIG. 2 is a top view of an example of a packaged RF amplifier device 200 that embodies the circuit of FIG. 1, and that includes an output impedance matching circuit 243 with RF cold point node 248 to which a video bandwidth circuit 249 is coupled, in accordance with an example embodiment. In contrast, FIG. 9, which will be discussed in detail later, illustrates an example embodiment with an improved RF cold point. The IPD bond pad intermediate point acts as a thermal cooling path for the wire bond array, namely the intermediate node for thermal cooling located between printed coil shunt inductance 135 and bondwire 134 in FIG. 9. The IPD bond pad enables also a connection to a shunt capacitor for $2^{nd}$ or $3^{rd}$ harmonic frequency control.

Figure 3:
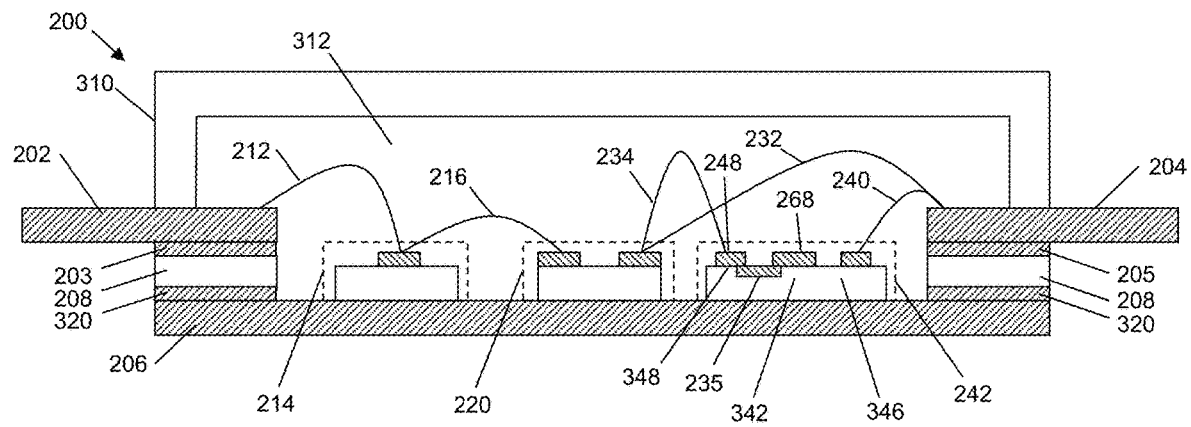
FIG. 3 is a cross-sectional, side view of the RF amplifier device of FIG. 2 along line 3-3.

For enhanced understanding, FIG. 2 should be viewed in conjunction with FIG. 3, which is a cross-sectional, side view of the semiconductor device 200 of FIG. 2 along line 3-3. More specifically, FIG. 3 is a cross-sectional view through input lead 202, input impedance matching circuit 210, transistor 220, output impedance matching circuit 243, and output lead 204. FIG. 3 also illustrates a cap 310, which may be implemented in air cavity package embodiments to seal the interior components of device 200 within an air cavity 312.

Device 200 includes an input lead 202 (e.g., input lead 102, FIG. 1), an output lead 204 (e.g., output lead 104, FIG. 1), a flange 206 (or "device substrate"), an isolation structure 208, one or more transistors 220 (e.g., transistor 120, FIG. 1), an input impedance matching circuit 210 (e.g., input impedance matching circuit 110, FIG. 1), a video bandwidth circuit 249 (e.g., video bandwidth circuit 149, FIG. 1), and an output impedance matching circuit 243 (e.g., output impedance matching circuit 150, FIG. 1), all of which may be packaged together as parts of the device. In the example of FIG. 2, device 200 includes three transistors 220 that essentially function in parallel, although another semiconductor device may include one or two transistors or more than three transistors, as well. In addition, device 200 includes three input capacitors 214 and three IPD assemblies 242, which also essentially function in parallel. It is to be understood that more or fewer of capacitors 214 and/or IPD assemblies 242 may be implemented, as well. For purposes of clarity, transistors 220, input capacitors 214, and IPD assemblies 242 each may be referred to in the singular sense, below, as will analogous components in other, later-described Figures. It is to be understood that the description of a particular device component in the singular sense applies to the set of all such components. According to an embodiment, jumper wires (not illustrated) may be electrically coupled between the multiple transistors 220, input capacitors 214, and IPD assemblies 242, in order to provide low frequency paths between corresponding components.

According to an embodiment, device 200 is incorporated in an air cavity package, in which transistors 220 and various impedance matching and video bandwidth elements 212, 214, 216, 232, 234, 240, and 242 are located within an enclosed air cavity 312. Basically, the air cavity is bounded by flange 206, isolation structure 208, and a cap 310 overlying and in contact with the isolation structure 208 and leads 202, 204. In FIG. 2, an example perimeter of the cap 310 is indicated by dashed box 218. In other embodiments, a device may be incorporated into an over-molded package (i.e., a package in which the electrical components within the active device area are encapsulated with a non-conductive molding compound, and in which portions of the leads 202, 204, and all or portions of the isolation structure 208 also may be encompassed by the molding compound).

Flange 206 includes a rigid electrically-conductive substrate, which has a thickness that is sufficient to provide structural support for electrical components and elements of device 200. In addition, flange 206 may function as a heat sink for transistors 220 and other devices mounted on flange 206. Flange 206 has a top and bottom surface (only a central portion of the top surface is visible in FIG. 2), and a substantially-rectangular perimeter that corresponds to the perimeter of the device 200 (e.g., to the perimeter of isolation structure 208, described below).

Flange 206 is formed from a conductive material, and may be used to provide a ground reference for the device 200. For example, various components and elements may have terminals that are electrically coupled to flange 206, and flange 206 may be electrically coupled to a system ground when the device 200 is incorporated into a larger electrical system. At least the surface of flange 206 is formed from a layer of conductive material, and possibly all of flange 206 is formed from bulk conductive material. Alternatively, flange 206 may have one or more layers of non-conductive material below its top surface. Either way, flange 206 has a conductive top surface. Flange 206 may more generally be referred to as a substrate with a conductive surface.

Isolation structure 208 is attached to the top surface of flange 206. For example, isolation structure 208 may include a layer of metallization 320 on its bottom surface, which may be soldered to or otherwise attached to the top surface of flange 206. Isolation structure 208 is formed from a rigid, electrically insulating material (i.e., a material with a dielectric constant in a range from about 2.0 to about 10.0, although materials with higher or lower dielectric constants may be used), and has a top surface and an opposed bottom surface. The term "isolation structure," as used herein, refers to a structure that provides electrical isolation between conductive features of a device (e.g., between leads 202, 204 and flange 206). For example, isolation structure 208 may be formed from inorganic materials (e.g., ceramic such as aluminum oxide, aluminum nitride, and so on) and/or organic materials (e.g., one or more polymers or PCB materials). In an embodiment in which isolation structure 208 comprises PCB materials (e.g., the isolation structure 208 essentially includes a single or multi-layer PCB), conductive layers (e.g., copper layers) may be included on the top and bottom surfaces of the isolation structure. In a further embodiment, a conductive layer on the top surface of the isolation structure 208 may be patterned and etched to form a leadframe (including leads 202, 204) for the device 200, and a conductive layer on the bottom surface of the isolation structure 208 may be coupled to the flange 206. In other embodiments, conductive layers may be excluded from the top and/or bottom surface of the isolation structure 208. In such embodiments, leads (e.g., leads 202, 204) may be coupled to the isolation structure 208 using epoxy (or other adhesive materials), and/or the isolation structure 208 may be coupled to the flange 206 using epoxy (or other adhesive materials). In still other embodiments, the isolation structure 208 may be milled at the portion of its top surface to which a lead is attached.

Isolation structure 208 has a frame shape, in an embodiment, which includes a substantially enclosed, four-sided structure with a central opening. Isolation structure 208 may have a substantially rectangular shape, as shown in FIG. 2, or isolation structure 208 may have another shape (e.g., annular ring, oval, and so on). Isolation structure 208 may be formed as a single, integral structure, or isolation structure 208 may be formed as a combination of multiple members. In addition, isolation structure 208 may be formed from a homogenous material, or isolation structure 208 may be formed from multiple layers.

The input and output leads 202, 204 are mounted on a top surface of the isolation structure 208 on opposed sides of the central opening, and thus the input and output leads 202, 204 are elevated above the top surface of the flange 206, and are electrically isolated from the flange 206. For example, the input and output leads 202, 204 may be soldered or otherwise attached to metallization 203, 205 on a top surface of isolation structure 208. The metallization 203, 205 may be considered to be conductive pads to which the input and output leads 202, 204 are coupled. Generally, the input and output leads 202, 204 are oriented in order to allow for attachment of bondwires (e.g., bondwires 212, 232, 240) between the input and output leads 202, 204 and components and elements within the central opening of isolation structure 208.

Transistors 220 and various elements 214, 242 of the input and output impedance matching circuits 210, 243 and video bandwidth circuits 249 are mounted on a generally central portion of the top surface of a flange 206 that is exposed through the opening in isolation structure 208. According to an embodiment, transistors 220 are positioned within the active device area of device 200, along with impedance matching and video bandwidth elements 214, 242. For example, the transistors 220, capacitors 214, and IPD assemblies 242 may be coupled to flange 206 using conductive epoxy, solder, solder bumps, sintering, and/or eutectic bonds.

Transistors 220 may be GaN-based transistors, in some embodiments, or silicon-based transistor, in other embodiments. Each transistor 220 has a control terminal (e.g., a gate) and two current conducting terminals (e.g., a drain and a source). The control terminal of each transistor 220 is coupled to the input impedance matching circuit 210. In addition, one current conducting terminal (e.g., the drain) is coupled to the output impedance matching circuit 243 and to the output lead 204. The other current conducting terminal (e.g., the source) is coupled to the flange 206 (e.g., to ground), in an embodiment.

The input impedance matching circuit 210 (e.g., input impedance matching circuit 110, FIG. 1) is coupled between the input lead 202 (e.g., input lead 102, FIG. 1) and the control terminal of the transistor 220 (e.g., transistor 120, FIG. 1). In the device 200 of FIG. 2, the input impedance matching circuit 210 includes two inductive elements 212, 216 (e.g., inductive elements 112, 116, FIG. 1) and a capacitor 214 (e.g., capacitor 114, FIG. 1). Each inductive element 212, 216 is formed from a plurality of parallel, closely-spaced sets of bondwires, in an embodiment. For example, a first inductive element 212 (e.g., inductive element 112, FIG. 1) includes a plurality of bondwires coupled between input lead 202 and a first terminal of capacitor 214 (e.g., capacitor 114, FIG. 1), and a second inductive element 216 (e.g., inductive element 116, FIG. 1) includes a plurality of bondwires coupled between the first terminal of capacitor 214 and the control terminal of transistor 220. The second terminal of capacitor 214 is coupled to the flange 206 (e.g., to ground). Capacitor 214 may be, for example, a discrete silicon capacitor, a discrete ceramic capacitor, or another type of capacitor. Bondwires 212, 216 are attached to a conductive top plate at the top surface of capacitor 214.

The output impedance matching circuit 243 (e.g., output impedance matching circuit 143, 150, FIG. 1) is coupled between a first current conducting terminal (e.g., drain) of transistor 220 (e.g., transistor 120, FIG. 1) and the output lead 204 (e.g., output lead 104, FIG. 1). In the device 200 of FIG. 2, the output impedance matching circuit 243 includes four inductive elements 232, 234, 235 (FIG. 3), 240 (e.g., inductors 132, 134, 135, 140, FIG. 1) and two capacitors 342, 346 (e.g., capacitors 142, 146, FIG. 1). As is more clearly indicated in FIG. 3, the capacitors 342, 346 of output impedance matching circuit 243 may be included in IPD assembly 242, according to an embodiment. In other embodiments, the capacitors 342 and/or 346 may not form a portion of an IPD assembly, but instead may be discrete capacitors that are distinct from each other, or capacitors that are formed in another type of assembly (e.g., an LTCC assembly). In still other alternate embodiments, either or both of the capacitors 342, 346 may be integrated into the transistor die (e.g., a die that includes transistor 220). As part of an IPD assembly 242, capacitors 342, 346 will be illustrated and described in more detail in conjunction with FIGS. 5 and 7. In an embodiment in which low-pass matching circuit 147 is excluded, IPD assembly 242 may exclude capacitor 346 (e.g., capacitor 146, FIG. 1).

Inductive elements 232, 234, 240 each may be formed from a plurality of parallel, closely-spaced sets of bondwires, in an embodiment. For example, a series inductive element 232 (e.g., series inductor 132, FIG. 1) includes a plurality of bondwires coupled between the first current conducting terminal (e.g., the drain) of transistor 220 and the output lead 204. A first shunt inductive element 234 (e.g., first shunt inductor 134, FIG. 1) may include a plurality of bondwires coupled between the first current conducting terminal of transistor 220 and intermediate node 248, which may be implemented as a conductive landing pad at the top surface of IPD assembly 242, in an embodiment. As will be described in more detail in conjunction with FIGS. 4-7, a second shunt inductive element is implemented as an integrated inductor 235. The second shunt inductive element 235 is electrically coupled between a RF cold point node 268 and a first terminal of shunt capacitor 342 (e.g., shunt capacitor 142, FIG. 1).

A low-pass matching inductive element 240 (e.g., low-pass matching inductor 140, FIG. 1) includes a plurality of bondwires coupled between the output lead 204 and another conductive landing pad at the top surface of IPD assembly 242, which in turn is electrically connected to a first terminal of low-pass matching capacitor 346 (e.g., low-pass matching capacitor 146, FIG. 1). Second terminals of capacitors 342, 346 are electrically connected to the flange 206 (e.g., to ground).

The embodiment of FIG. 2 corresponds to a two-lead device (e.g., a device having one input lead 202 and one output lead 204, FIG. 2). Such a device may be incorporated into a larger electrical system by physically coupling the device to a PCB, electrically connecting the input lead to a signal source, and electrically connecting the output lead to a load. The PCB may further include one or more bias feeds (e.g., each with a length of lambda/4 or some other length) with proximal ends located close to the PCB connection(s) to the output lead and/or input lead. A blocking capacitor at the distal end of each bias lead may provide a short at a given RF frequency, which when transformed through the bias lead, appears as an open circuit.

Other embodiments include devices with multiple input leads and/or multiple output leads (e.g., one input/output lead for each transistor). Still other embodiments include devices with bias leads formed as integral portions of the device, and additional conductive features that coupled the bias leads with the impedance matching network(s). Further, although the illustrated embodiments depict a single amplification stage (i.e., a single power transistor 220) along each amplification path, other device embodiments may include multi-stage amplifiers (e.g., transistor die with both preamplifier and high-power amplifier transistors coupled in cascade). Further still, some of the various components of the input and output impedance matching circuits and the video bandwidth circuits may be integrated into (or coupled to) the transistor die, in other embodiments.

As will be illustrated and explained in more detail below in conjunction with FIGS. 4-7, elements of the video bandwidth circuit 249 (e.g., video bandwidth circuit 149, FIG. 1) may be included as portions of the IPD assembly 242, in an embodiment. More specifically, in an embodiment, the envelope inductance (e.g., envelope inductor 136, FIG. 1), envelope resistor (e.g., envelope resistor 138, FIG. 1), and envelope capacitor (e.g., envelope capacitor 144, FIG. 1) are located in or on IPD assembly 242, and are electrically coupled with the rest of the output impedance matching circuit 243 through RF cold point node 268. In other embodiments, some or all elements of the video bandwidth circuit 249 may be implemented as discrete components that do not form a portion of an IPD assembly.

FIG. 4 illustrates a first top view of an IPD assembly 400 (e.g., IPD assembly 242, FIG. 2) suitable for use in an output circuit (e.g., an output impedance matching circuit 150, 243 and video bandwidth circuit 149, 249, FIGS. 1, 2) in a packaged RF amplifier device (e.g., device 200, FIG. 2), in accordance with an example embodiment. For enhanced understanding, FIG. 4 should be viewed in conjunction with FIG. 5, which illustrates a cross-sectional, side view of IPD assembly 400 along line 5-5.

According to an embodiment, IPD assembly 400 includes an IPD substrate 410, and RF cold point node 468. A first shunt inductance 434 (e.g., first shunt inductance 134, 234, FIGS. 1, 2), in the form of a plurality of bondwires, is coupled between a transistor (e.g., transistor 120, 220, FIGS. 1, 2) and a first intermediate node 448, which is a landing pad for wire bond attachment in FIG. 4. In addition, and electrically coupled to the intermediate node 448, IPD assembly 400 includes a second shunt inductance 435 in a form of an IPD shunt inductance, a shunt capacitor 442 (e.g., capacitor 142, FIG. 1), envelope capacitors 444 (e.g., two parallel instances of capacitor 144, FIG. 1), envelope resistors 438 (e.g., two parallel instances of resistor 138, FIG. 1), and a low-pass matching capacitor 446 (e.g., capacitor 146, FIG. 1). A shunt low value capacitor 474 is connected to landing pad 448.

In the illustrated embodiment, the second shunt inductance 435 is implemented as one or more integrated inductors that are electrically connected between first intermediate node 448 and a second conductive feature that contains the RF cold point node 468 and that is exposed at the top surface of IPD substrate 410. Although FIG. 4 illustrates four integrated inductors 435 coupled in parallel between node 448 and shunt capacitors 442, more or fewer integrated inductors 435 may be implemented.

The second shunt inductance 435 is implemented as one or more integrated inductors (e.g. a printed coil formed from one or more patterned conductive layers) whose value is calculated to achieve a thermal management of the shunt L output pre-match. The inductance synthesis with a bondwire-only implementation may not meet thermal management requirements (e.g., when the bondwire temperature may be above 200° C. during operation), and embodiments of the invention instead implement an integrated second shunt inductance 435. In the illustrated embodiment, particularly for an amplifier using GaN technology and benefitting from a low $C_{ds}$ pre-matching topology, the wire inductance 434 is not dominant over inductance 435 in the context of the overall shunt inductance (i.e., wire inductance 434 is relatively small in comparison to inductance 435).

The second conductive pad is electrically coupled to (or forms a portion of) the shunt capacitor 442. In an embodiment, shunt capacitor 442, envelope resistors 438, and low-pass matching capacitors 446 are integrally formed in the IPD substrate 410, and envelope capacitors 444 are discrete components that are mounted on a surface of the IPD substrate 410. In an alternate embodiment, envelope capacitor 444 also may be integrated into IPD substrate 410. In an embodiment in which low-pass matching circuit 147 is excluded, IPD assembly 400 may exclude low-pass matching capacitor 446 (e.g., capacitor 146, FIG. 1).

IPD substrate 410 includes a base semiconductor substrate 510 with top and bottom surfaces 512, 514. The base semiconductor substrate 510 may be formed from any of a variety of semiconductor materials, including but not limited to silicon, gallium arsenide, gallium nitride, and so on. A plurality of conductive layers 520, 522 and dielectric layers 526, 528 are formed over the top surface 512 of the substrate 510, and an additional conductive layer 524 is formed on the bottom surface 514 of the base semiconductor substrate 512 to facilitate physical and electrical attachment to an underlying structure, according to an embodiment. For example, conductive layer 524 may be a gold (or other metal) layer, which facilitates forming a eutectic bond between IPD substrate 410 and a separate conductive substrate (e.g., flange 206, FIG. 2). Alternatively, conductive layer 524 may be a metal layer, which facilitates sintering (e.g., silver sintering) IPD substrate 410 to the separate conductive substrate. The insulating layer 526 functions to selectively electrically isolate the conductive layers 520, 522.

Figure 5:
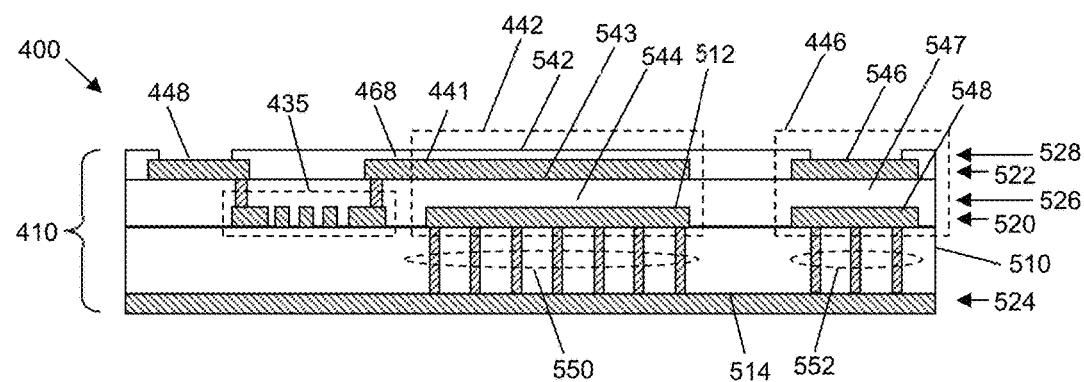
FIG. 5 is a cross-sectional side view of the IPD assembly of FIG. 4 along line 5-5.

Referring to FIGS. 4 and 5, and as mentioned above, IPD assembly 400 includes a second shunt inductance 435 implemented as one or more integrated inductors that are electrically connected between a conductive landing pad of the intermediate node 448 and RF cold point node 468. The second shunt inductance 435, first shunt inductance 434 and the shunt capacitor 442 form a series resonant circuit with a resonant frequency in proximity to the center operating frequency of the RF power amplifier device, in an embodiment. More specifically, the second shunt inductance 435 and the shunt capacitor 442 are configured to have inductance and capacitance values, respectively, that will cause the series combination to resonate at a frequency that is in proximity to the center operating frequency of the device, in addition to the second shunt inductance 435 having a value that is dominant over the bondwire inductance 434 in a combined total shunt inductance value. As used herein, and according to an embodiment, the term "in proximity to the center operating frequency" means "within 20 percent of the center operating frequency." Accordingly, for example, when a device has a center operating frequency of 2.0 gigahertz (GHz), a frequency that is "in proximity to the center operating frequency" corresponds to a frequency that falls in a range from 1.8 GHz to 2.2 GHz. Although 2.0 GHz is given as an example center operating frequency, a device may have a center operating frequency that is different from 2.0 GHz, as well. In alternate embodiments, the term "in proximity to the center operating frequency" may mean "within 10 percent of the center operating frequency" or "within 5 percent of the center operating frequency."

A good approximation of the resonant frequency, $F_R$, of the series resonant circuit that includes first shunt inductance 434, $L_{shunt1}$, second shunt inductance 435, $L_{shunt2}$, and shunt capacitor 442, $C_{shunt}$ (in FIG. 4) is given by:

$$F_R = \frac{1}{2\pi\sqrt{(L_{shunt}C_{shunt})}} = \frac{1}{2\pi\sqrt{((L_{shunt1}+L_{shunt2})C_{shunt})}} \quad \text{(Eqn. 1)}$$

Accordingly, for example, when the device is designed to have a center operating frequency of about 2.0 GHz, $L_{shunt3}$ may have an inductance value of about 39.5 pH, and $C_{shunt}$ may have a capacitance value of about 160 pF, although other values may be used, as well. In such an embodiment, reasonable approximate values for the other components of the output impedance matching circuit 243 and video bandwidth circuit 249 may be selected as follows: $L_{series}$ 232=333 pH; $R_{env}$ 238=0.5 ohm; $C_{env}$=30 nF; $L_{env}$=70 pH; and $L_{shunt1}+L_{shunt2}$=209.5 pH. Of course, other values may be selected as well, particularly when the center operating frequency of the device is different from 2.0 GHz.

According to an embodiment, shunt capacitor 442 and low-pass matching capacitor 446 each are implemented as metal-insulator-metal (MIM) capacitors (e.g., with parallel metal plates electrically separated by a thin dielectric (e.g., a thin nitride or oxide)). Accordingly, in an embodiment, shunt capacitor 442 includes a top capacitor electrode 542 formed from a portion of conductive layer 522, a bottom capacitor electrode 544 formed from a portion of conductive layer 520, and vertically aligned with the top capacitor electrode 542, and dielectric material 543 formed from a portion of insulating layer 526. Similarly, low-pass matching capacitor 446 includes a top capacitor electrode 546 formed from a portion of conductive layer 522, a bottom capacitor electrode 548 formed from a portion of conductive layer 520 and vertically aligned with the top capacitor electrode 546, and dielectric material 547 formed from a portion of insulating layer 526.

According to an embodiment, IPD substrate 410 also includes first and second sets of conductive through substrate vias (TSVs) 550, 552 extending between the top and bottom surfaces 512, 514 of substrate 510. The first set of TSVs 550 is electrically coupled to the bottom capacitor electrode 544 of shunt capacitor 442, and the second set of TSVs 552 is electrically coupled to the bottom capacitor electrode 548 of low-pass matching capacitor 446. In addition, both the first and second sets of TSVs 550, 552 are electrically coupled to the conductive layer 524 on the bottom surface 514 of the substrate 510. In an alternate embodiment, conductive pads or balls may be coupled to the ends of the TSVs 550, 552 that are coplanar with the bottom surface 514 of the substrate 510, rather than being electrically coupled to conductive layer 524. In yet another alternate embodiment, TSVs 550 and/or 552 may be replaced by edge plating or castellations on the side surface(s) of IPD substrate 410, which extend between the top and bottom surfaces of substrate 510.

IPD substrate 410 also includes a third conductive landing pad 447 exposed at the top surface of IPD substrate 410 to facilitate interconnection of low-pass matching capacitor 446 to external circuitry (e.g., output lead 104, 204, FIGS. 1, 2). More specifically, landing pad 447 is electrically connected to the top capacitor electrode 546 of the low-pass matching capacitor 446, and landing pad 447 is configured to accept attachment of one or more bondwires (e.g., bondwires 440). The landing pads 447, 448 may be formed from the same conductive layer 522 as top electrodes 542, 546, as illustrated in FIG. 5, or the landing pads 447, 448, may be formed from different conductive layers than top electrodes 542, 546.

Although the electrodes 542, 544, 546, 548 of the shunt and low-pass matching capacitors 442, 446 are illustrated as being formed from portions of the same conductive layers (i.e., layers 520, 522), the electrodes 542, 544, 546, 548 of capacitors 442, 446 may be formed from portions of different layers from each other and/or from different layers than those depicted in FIG. 5 (e.g., one or more other conductive layers, not illustrated, may be present below or above the conductive layers 520, 522 from which capacitors 442, 446 are formed). In addition, although each of capacitors 442, 446 are illustrated as simple parallel plate capacitors consisting of a single top electrode and a single bottom electrode, either or both of capacitors 442, 446 could have other types of capacitor structures, as well (e.g., the electrodes could consist of multiple, interleaved conductive structures, and so on).

As mentioned above, IPD assembly 400 also includes one or more series-coupled video bandwidth circuits (e.g., video bandwidth circuit 149, FIG. 1). In the illustrated embodiment, IPD assembly 400 includes two instances of video bandwidth circuits, each including an envelope resistor 438 (e.g., resistor 138, FIG. 1), an envelope capacitor 444 (e.g., capacitor 144, FIG. 1), and a relatively small envelope inductance (e.g., inductance 136, FIG. 1) composed of a series combination of small series inductances from conductive pads 430, 432, and conductive TSVs 436 (indicated as dashed circles in FIG. 4), which extend between contact pads 432 and the bottom surface 514 of the IPD substrate 410. An advantage to the embodiments of FIGS. 4 and 5 is that the envelope inductance may be reduced to a negligible amount of inductance (e.g., <100 pH), which may improve performance by improving the low frequency resonance frequency of device.

In the embodiment illustrated in FIG. 4, the first video bandwidth circuit (e.g. video bandwidth circuit 143, 243, FIGS. 1, 2) is positioned at and electrically connected to a first end of conductive pad 448. A second video bandwidth circuit (e.g., video bandwidth circuit 149, 249, FIGS. 1, 2) is positioned at and electrically connected between a first end of the second conductive feature equating to RF cold point node 468, and a ground reference (e.g., conductive layer 524 on the bottom surface 514 of substrate 510). The two circuits are coupled in parallel between conductive pad 448 and conductive layer 524 (or the ground reference point). In other embodiments, the video bandwidth circuit may include only one series-coupled circuit (e.g., only one capacitor 444 and one resistor 438) or more than two series-coupled circuits (e.g., more than two capacitors 444 and resistors 438).

The envelope resistor(s) 438 may be integrated as part of IPD substrate 410. For example, each envelope resistor 438 may be a polysilicon resistor formed from a layer of polysilicon overlying semiconductor substrate 510, and electrically coupled between the second conductive pad formed by shunt capacitors 442 and the RF cold point 468 node and 430 (e.g., using conductive vias and possibly other conductive layers, not shown). In other alternate embodiments, the envelope resistor(s) 438 may be formed from tungsten silicide or another material, may be thick or thin film resistors, or may be discrete components coupled to a top surface of IPD substrate 410.

According to an embodiment, the envelope capacitor(s) 444 may be configured to have a relatively high voltage rating (e.g., between about 40 and about 150 volts, although the voltage rating may be higher or lower, in other embodiments). Each of the envelope capacitor(s) 444 may be, for example, a discrete capacitor that is connected (e.g., using solder, a conductive epoxy, or other means) to a top surface of IPD substrate 410. More specifically, a first terminal 443 of each capacitor 444 may be connected to a first contact pad 430 that is exposed at a top surface of the IPD substrate 410, and a second terminal 445 of each capacitor 444 may be connected to a second contact pad 432 that is exposed at the top surface of the IPD substrate 410.

Each capacitor 444 may be a multiple-layer capacitor (e.g., a multiple-layer ceramic capacitor) with parallel, interleaved electrodes and wrap-around end terminations 443, 445. Alternatively, each capacitor 444 may form a portion of a separate IPD (e.g., a MIM capacitor formed on a semiconductor substrate), or may be another capacitor (e.g., a trench or other type of capacitor) formed within IPD substrate 410. Alternatively, each capacitor 444 may be implemented as another type of capacitor capable of providing the desired capacitance and voltage for the video bandwidth circuit.

Contact pads 430, 432 may, for example, be formed from the same conductive layer 522 as conductive pads 447, 448, although they may be formed from other conductive layers, as well. According to an embodiment, IPD substrate 410 also includes sets of TSVs 436, which electrically connect contact pad(s) 432 to conductive layer 524 (e.g., to the ground reference node). TSVs 436 essentially provide electrical connectivity between contact pad(s) 432 and the bottom surface 514 of substrate 510. In an alternate embodiment, conductive pads or balls may be coupled to the ends of the TSVs 436 that are coplanar with the bottom surface 514 of the substrate 510, rather than being electrically coupled to conductive layer 524. In yet another alternate embodiment, TSVs 436 may be replaced by edge plating or castellations on the side surface(s) of IPD substrate 410, which extend between the top and bottom surfaces of IPD substrate 410.

IPD assembly 400 includes a plurality of integrated inductors 435 to provide the second shunt inductance (e.g., second shunt inductance 135, FIG. 1), whereby each integrated inductor 435 is formed from a conductive coil that is implemented using one or more of the conductive layers 520, 522 overlying the semiconductor substrate 510. A first end of each coil is electrically connected to node 448, and a second end of each coil is electrically connected to RF cold point node 468, which may in turn function as the top plate of shunt capacitor 442. In this manner, each integrated inductor 435 is electrically coupled between node 448 and the shunt capacitor 442.

The embodiment illustrated in FIG. 4 includes two series-coupled circuits positioned proximate to opposite sides of IPD substrate 410, with each including an envelope resistor 438 and an envelope capacitor 444. In other embodiments, IPD assembly 400 may have only one series-coupled circuit with one envelope resistor and one envelope capacitor, or may have more than two of such series coupled circuits.

In addition, each of envelope resistor 438 and envelope capacitor 444 may be implemented as multiple components (coupled in series and/or in parallel), and/or the series arrangement may be different (e.g., envelope capacitor 444 may be coupled to a conductive feature or node equating to RF cold point node 468), and envelope resistor 438 may be coupled between envelope capacitor 444 and conductive layer 524 (or the ground reference point). Further, the series-coupled envelope resistor and envelope capacitor circuit(s) may be located at different positions on the IPD substrate 410.

FIGS. 9 and 10 depict a schematic diagram and top view of an IPD assembly 1000, respectively, which embodies a more ideal RF cold point. More specifically, FIG. 10 illustrates a top view of an alternate embodiment of an IPD assembly 1000 (e.g., IPD assembly 242, FIG. 2) suitable for use in an output circuit (e.g., an output impedance matching circuit 150, 243 and video bandwidth circuit 149, 249, FIGS. 1, 2) in a packaged RF amplifier device (e.g., device 200, FIG. 2), in accordance with an example embodiment. Referring to both FIGS. 9 and 10, the IPD assembly 1000 may provide a more ideal RF cold point node 968, which is located between first integrated inductors 435 (e.g., Lshunt-2, FIG. 9) and second integrated inductors 935 (e.g., Lshunt-3, FIG. 9), where the second integrated inductors 935 are introduced to provide a better RF cold point to which the envelope frequency termination circuit (e.g., comprising inductor 160, resistor 164, and capacitor 166) may be connected.

Referring back to FIG. 4, although IPD substrate 410 is illustrated as including only two conductive layers 520, 522, and two dielectric layers 526, 528 overlying the top surface 512 of substrate 510, alternate embodiments of an IPD that provides substantially the same functionality may include more than two conductive and/or dielectric layers. In addition, although IPD assembly 400 illustrates an embodiment that includes one shunt capacitor 442, two envelope capacitors 444, two envelope resistors 438, and one low-pass matching capacitor 446, alternate embodiments may include more than one shunt and/or low-pass matching capacitor 442, 446 (e.g., with sets of the same type of capacitor being arranged in parallel or series), and/or one or more than two envelope capacitors 444 and/or envelope resistors 438. In addition, although FIG. 4 illustrates layouts in which the shunt and low-pass matching capacitors 442, 446 are arranged toward one side of the IPD assembly 400, and the RF cold point node 468 is arranged toward the other side of the IPD assembly 400, the various components may be arranged differently, in other embodiments (e.g., the RF cold point node 468 may be positioned between the shunt and low-pass matching capacitors 442, 446, and/or may be positioned closer to the output lead 204 (FIG. 2) than the shunt capacitor 442).

Figure 6:
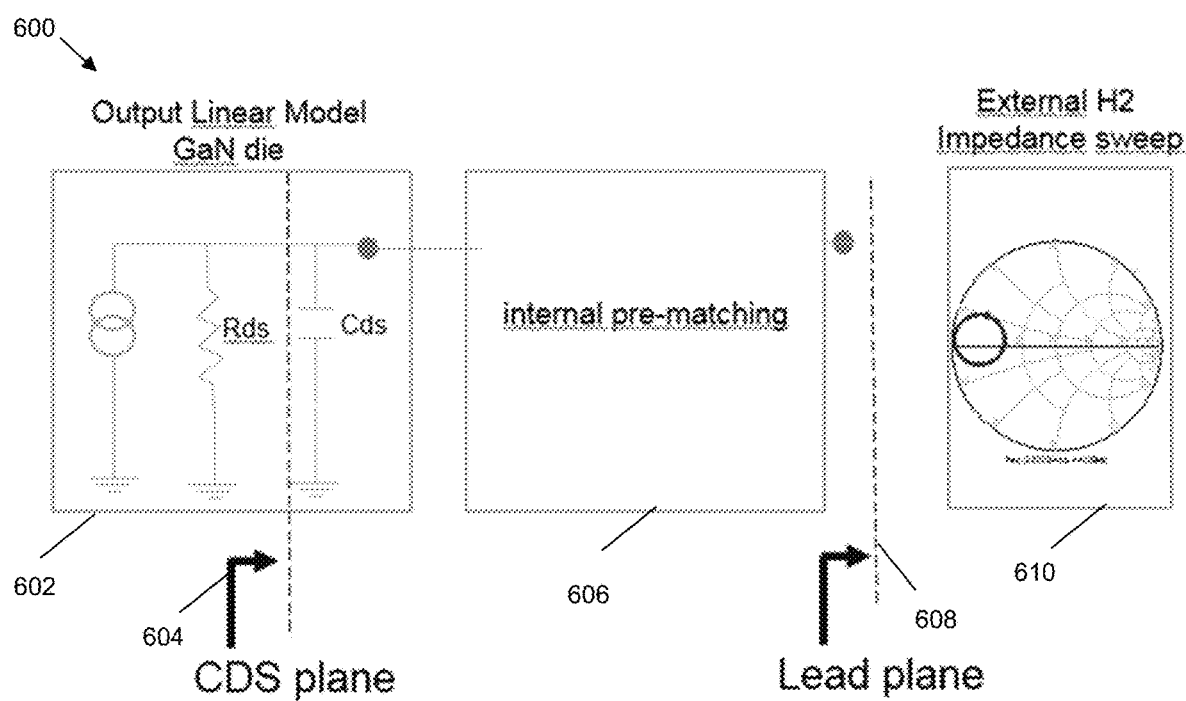
FIG. 6 illustrates a H2 impedance simulation configuration in order to analyze an effect in the $C_{ds}$ plane.

FIG. 6 illustrates an example of a H2 impedance simulation 600 configuration in order to analyze an effect in the $C_{ds}$ plane 604 of a linear model 602 of a GaN RF amplifier (such as transistor 120 in FIG. 1). The output of the linear model 602 is connected to a simulated internal pre-matching circuit 606, which then illustrates an effect of the GaN RF amplifier with pre-matching in the lead plane 608. For the simulation, the H2 impedances presented to the lead plane 608 takes into consideration the bias feed effect of a conventional external circuit matching. The output of the H2 impedance simulation 600 is an impedance sweep example Smith chart 610.

Figure 7:
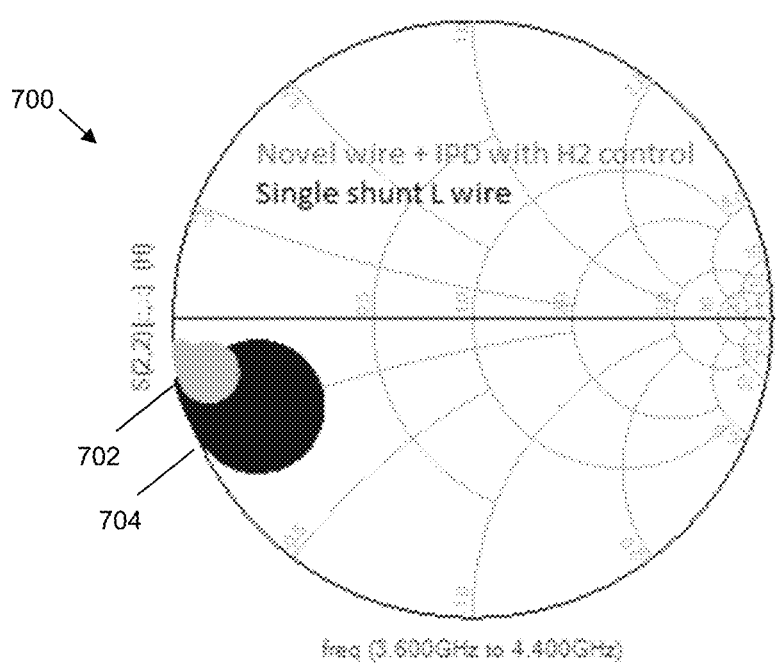
FIG. 7 is a Smith chart comparing the H2 Impedance sweep observed in the $C_{ds}$ plane with and without harmonic controlled pre-match.

FIG. 7 illustrates an example Smith chart 700 comparing a H2 impedance sweep observed in the $C_{ds}$ plane for a GaN RF amplifier (such as transistor 120 in FIG. 1). The example Smith chart 700 compares the performance of a GaN RF amplifier with harmonic controlled pre-match 702, in accordance with an embodiment, to the performance of a GaN RF amplifier without harmonic controlled pre-match 704. The GaN RF amplifier with harmonic controlled pre-match (yielding result 702) includes a split shunt inductance, whereby a second inductance of the split shunt inductance is an integrated inductance. In contrast, the GaN RF amplifier without harmonic controlled pre-match (yielding result 704) includes a single shunt L wire. As illustrated, the Smith Chart area is smaller in the case of the harmonic controlled pre-match 702, i.e. the second harmonic termination will fall in that impedance region whatever the outside world second harmonic impedance presented at the drain lead reference plane.

Figure 8:
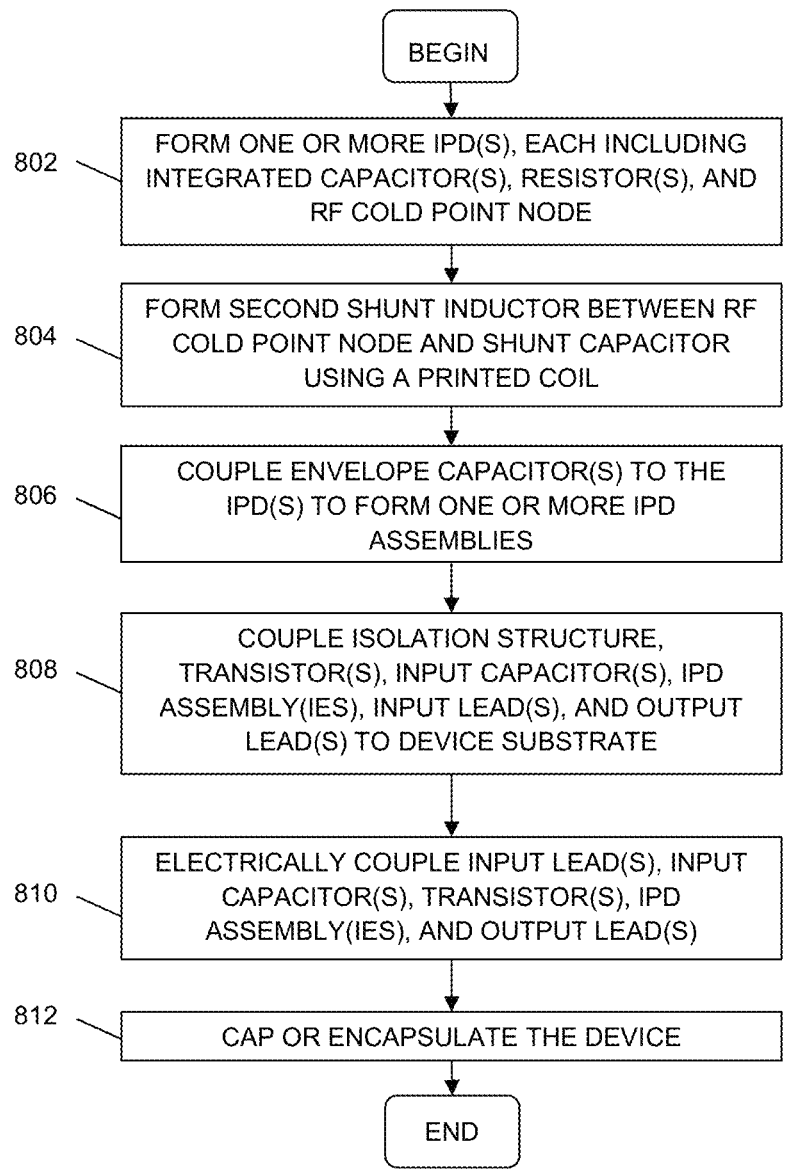
FIG. 8 is a flowchart of a method of manufacturing a packaged RF device, in accordance with an example embodiment.

FIG. 8 is a flowchart of a method of manufacturing a packaged RF device (e.g., device 200, FIG. 2) with a modified shunt inductor arrangement that includes a relatively large second IPD shunt inductance to provide low $C_{ds}$ capacitance compensation and an improved thermal path, in accordance with an example embodiment. In example embodiments, a lower value C1 than the value required to short circuit a $2^{nd}$ harmonic of an output of a GaN RF amplifier (such as transistor 120 in FIG. 1) is set to maintain a compensation bandwidth at a fundamental frequency. In example embodiments, a low frequency video bandwidth decoupling circuit is made with a HiC cap C2 166 connected through an L2 wire inductance 160 to the RF cold point 168 created on the IPD by the $C_{shunt}$ capacitance 142 in FIG. 1.

The method may begin, in 802-806, by forming one or more IPD assemblies. For example, at 802, one or more IPDs (e.g., IPD 410 of FIG. 4 or 1000 of FIG. 10) may be formed, which includes one or more integrated capacitors (e.g., shunt capacitor 442 and low-pass matching capacitor 446, FIGS. 4-5, 10), and one or more envelope resistors (e.g., resistor 438, FIGS. 4, 10). In alternate embodiments, each IPD may exclude the low-pass matching capacitor and/or the envelope resistor(s) (e.g., the envelope resistor(s) may be implemented as discrete components later mounted to each IPD). In addition, in another embodiment, the IPD also may include one or more integrated high-capacitance, high-voltage envelope capacitors. In addition to forming the passive components of each IPD, forming each IPD also includes forming various conductive features (e.g., conductive layers and vias), which facilitate electrical connection between the various components of each IPD assembly.

Forming the IPD also includes forming an RF cold point node (e.g., RF cold point node 468, FIGS. 4-5, 10), which may or may not be accessible at a surface of the IPD. At 804, and referring also to FIGS. 4, 5, 9, and 10, forming the IPD also may include forming and interconnecting one or more integrated inductors (e.g., corresponding to second shunt inductor 135, 235, 435, 935, FIGS. 1, 3, 4, 9, 10) between IPD input node (e.g., node 448), the RF cold point node (e.g., RF cold point node 468), and the shunt capacitor (e.g., shunt capacitor 442).

At 806, in embodiments in which the envelope capacitor is not integrated with the IPD, one or more discrete, high-voltage, high-capacitance envelope capacitors (e.g., capacitors 444, FIGS. 4, 10) are coupled to each IPD in series with the envelope resistor(s). As described previously, this results in the formation of one or more IPD assemblies, each of which includes at least a RF cold point node (e.g., RF cold point node 468), a second shunt inductance (e.g., integrated inductors 435, 935), a shunt capacitor (e.g., shunt capacitor 442) and one or more video bandwidth circuit(s) coupled in parallel between the RF cold point node and a ground reference (e.g., conductive layer 524, FIG. 5).

At 808, for an air cavity embodiment, an isolation structure (e.g., isolation structure 208, FIG. 2) is coupled to a device substrate (e.g., flange 206). In addition, one or more active devices (e.g., transistors 220), input impedance matching circuit elements (e.g., capacitors 214), and IPD assemblies (e.g., IPD assemblies 242, 400, 1000) are coupled to a portion of the top surface of the substrate that is exposed through an opening in the isolation structure. Leads (e.g., input and output leads 202, 204, and bias leads, if included) are coupled to the top surface of the isolation structure. In an alternate embodiment, a conductive layer on the top surface of the isolation structure may be patterned and etched to form a leadframe (e.g., prior to coupling the isolation structure to the flange). For overmolded (e.g., encapsulated) device embodiments, the isolation structure may be excluded, and the substrate and leads may form portions of a leadframe.

At 810, the input lead(s), input capacitor(s), transistor(s), IPD assembly(ies), and output lead(s) are electrically coupled together. For example, the electrical connections may be made using bondwires between the various device components and elements, as discussed previously. Finally, at 812, the device is capped (e.g., with cap 310) or encapsulated (e.g., with mold compound, not illustrated). The device may then be incorporated into a larger electrical system.

Referring again to FIG. 9, a schematic diagram of an RF amplifier with input and output impedance matching and envelope frequency termination circuits is illustrated in accordance with an example embodiment. FIG. 9 is comparable to the circuit of FIG. 1, and thus, for the common components, a replication of the text will not be repeated here. In particular, FIG. 9 illustrates a circuit that provides a more ideal RF cold point, whereby the output shunt L is split into three inductive elements, namely: connection bondwire 134 together with integrated inductor 135 on IPD and a second integrated inductor 935 on IPD that represents a RF cold point improvement inductance.

In some examples, of FIG. 9, connection bondwire 134 provides an inductive connection and the main inductance may be integrated inductor 135. The series resonant circuit includes, in FIG. 9 in a first example, first shunt inductance 134, $L_{shunt1}$, second shunt inductance 135, $L_{shunt2}$, third shunt inductance 935 (RF cold point improvement inductance), $L_{shunt3}$, and shunt capacitor 142, $C_{shunt}$. The series resonant circuit includes, in FIG. 9 in a second alternative example 143', first shunt inductance 134', $L_{shunt1}$, second shunt inductance 135', $L_{shunt2}$, third shunt inductance 935', $L_{shunt3}$, and shunt capacitor 142', $C_{shunt}$. In this second alternative example 143', the RF cold point 168' remains with third shunt inductance 935' and shunt capacitor 142', $C_{shunt}$ being reversed.

Although envelope inductance 136, 164 is represented as a single component in FIG. 1, in actuality envelope inductance 136 may consist of multiple small inductances from multiple low-inductance connections within the envelope frequency termination circuit 149. According to an embodiment, a first terminal of envelope resistor 138 is coupled to the RF cold point 168, 168', 968, through a first low-inductance connection (e.g., a portion of a conductive feature) that represents a first portion of envelope inductance 136, 160. A second terminal of envelope resistor 138 is coupled to a first terminal of envelope capacitor 144, 166 through a second low-inductance connection (e.g., contact pad 430, FIG. 4) that represents a second portion of envelope inductance 136, 160. A second terminal of the envelope capacitor 144 is coupled to ground (or another voltage reference), in an embodiment, through a third low-inductance connection (e.g., bond pad 432 and vias 436, FIG. 4) that represents a third portion of envelope inductance 136, 160. Envelope resistor 138, 164 may have a value in a range between about 0.1 ohm to about 5.0 ohm, and envelope capacitor 144, 166 may have a value in a range between about 5 nanofarads (nF) to about 1 microfarad (µF), although these components may have values outside of these ranges, as well. Envelope inductance 136, 160 due to the low-inductance connections between shunt capacitor 142, resistor 138, 164, capacitor 144, 166, and ground (or another voltage reference) may have a value less than about 500 pH, in an embodiment (e.g., as low as 50 pH, in an embodiment, or possibly even lower).

FIG. 10 is a top view of an IPD assembly 1000 that includes a portion of an output impedance matching circuit and an envelope frequency termination circuit, in accordance with the example embodiment of FIG. 9. FIG. 10 is comparable to the top view of an IPD assembly of FIG. 4, and thus, for the common components, a replication of the text will not be repeated here. In particular, FIG. 10 illustrates a circuit that provides a more ideal RF cold point, whereby the output shunt L is split into three inductive elements, namely: connection bondwire 134 together with a first integrated inductor 135 on the IPD 1000 and a second integrated inductor 935 on the IPD 1000, where the second integrated inductor 935 represents a cold point improvement inductance.

An embodiment of an RF amplifier includes a transistor with a control terminal and first and second current carrying terminals, and a shunt circuit coupled between the first current carrying terminal and a ground reference node. The shunt circuit includes a first shunt inductance formed from bondwires, a second shunt inductance formed from a printed coil, and a shunt capacitor coupled in series. The second shunt inductance and the shunt capacitor form a series resonant circuit in proximity to a center operating frequency of the amplifier, and a RF cold point node is present between the second inductance and the shunt capacitor. The RF amplifier also includes a video bandwidth circuit coupled between the RF cold point node and a ground reference node.

An embodiment of a packaged RF amplifier device includes a device substrate, a transistor coupled to the device substrate, and a shunt circuit coupled to the device substrate. The transistor includes a control terminal and first and second current carrying terminals. The shunt circuit is coupled to the device substrate between the first current carrying terminal and a ground reference node. The shunt circuit includes a first shunt inductance formed from bondwires, a second shunt inductance formed from a printed coil, and a shunt capacitor coupled in series. The second shunt inductance and the shunt capacitor form a series resonant circuit in proximity to a center operating frequency of the RF amplifier device, and a RF cold point node is present between the second inductance and the shunt capacitor. The device also includes a video bandwidth circuit coupled to the device substrate between the RF cold point node and a ground reference node.

An embodiment of a method of manufacturing an RF amplifier device includes coupling a transistor to a device substrate, where the transistor includes a control terminal and first and second current carrying terminals. The method also includes coupling a shunt circuit to the device substrate between the first current carrying terminal and a ground reference node. The shunt circuit includes a first shunt inductance formed from bondwires, a second shunt inductance formed from a printed coil, and a shunt capacitor coupled in series. The second shunt inductance and the shunt capacitor form a series resonant circuit in proximity to a center operating frequency of the RF amplifier device, and a RF cold point node is present between the second inductance and the shunt capacitor. The method also includes coupling a video bandwidth circuit to the device substrate between the RF cold point node and a ground reference node.

Thus, examples of the invention propose a Silicon IPD and a GaN transistor device with the aforementioned output matching topology.

Lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context. The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency, RF, amplifier comprising:
a transistor with a control terminal and first and second current carrying terminals;
an output pre-match impedance conditioning shunt circuit coupled between the first current carrying terminal and a ground reference node, wherein the output pre-match impedance conditioning shunt circuit includes at least a first inductance, a second inductance, and a first capacitor coupled in series, wherein an intermediate node is between the first and second inductances, an RF cold point node is between the second inductance and the first capacitor, the first inductance comprises a plurality of bondwires coupled between the first current carrying terminal and the second inductance, and the second inductance comprises an integrated inductor coupled between the first inductance and a first terminal of the first capacitor;
a second capacitor with a first terminal connected to the intermediate node, and a second terminal connected to the ground reference node; and
a video bandwidth circuit coupled between the RF cold point node and the ground reference node.

2. The RF amplifier of claim 1, wherein the video bandwidth circuit comprises:
a third inductance and a third capacitor coupled in series between the RF cold point node and the ground reference node.

3. The RF amplifier of claim 1, wherein the output pre-match impedance conditioning shunt circuit generates a 90° phase shift in the output of the transistor for use with an inverted Doherty architecture.

4. The RF amplifier of claim 1, wherein the transistor is a Gallium Nitride RF transistor and the output pre-match impedance conditioning shunt circuit is configured to compensate for a low drain-source capacitance of the Gallium Nitride RF transistor.

5. The RF amplifier of claim 1, wherein the second inductance and the first capacitor form a series resonant circuit, which resonates at a resonant frequency in proximity to a center operating frequency of the RF amplifier.

6. The RF amplifier of claim 1, wherein:
the first inductance and second inductance have a total inductance value in a range of 100 picohenries to 3 nanohenries; and
the first capacitor has a capacitance value in a range of 50 picofarads to 500 picofarads.

7. A packaged radio frequency (RF) amplifier device comprising:
a device substrate;
a transistor coupled to the device substrate, wherein the transistor includes a control terminal and first and second current carrying terminals;
an output pre-match impedance conditioning shunt circuit coupled to the device substrate between the first current carrying terminal and a ground reference node, wherein the shunt circuit includes at least a first inductance, a second inductance, and a first capacitor coupled in series, wherein an intermediate node is between the first and second inductances, an RF cold point node is between the second inductance and the first capacitor, the first inductance comprises a plurality of bondwires coupled between the first current carrying terminal and the second inductance, and the second inductance comprises an integrated inductor coupled between the first inductance and a first terminal of the first capacitor;
a second capacitor with a first terminal connected to the intermediate node, and a second terminal connected to the ground reference node; and
a video bandwidth circuit coupled between the RF cold point node and the ground reference node.

8. The packaged RF amplifier device of claim 7, further comprising:
a passive device substrate coupled to the device substrate, wherein the passive device substrate includes the second inductance, the first capacitor, a first conductive pad, and a second conductive pad that is electrically coupled to a first terminal of the first capacitor and corresponds to the RF cold point node, wherein the first conductive pad is exposed at a surface of the passive device substrate, the first plurality of bondwires is coupled to the first conductive pad, and the integrated inductor is coupled between the first and second conductive pads.

9. The packaged RF amplifier device of claim 7, further comprising:
a passive device substrate coupled to the device substrate, wherein the video bandwidth circuit includes a third inductance, a resistance, and a third capacitor coupled to the passive device substrate.

10. The packaged RF amplifier device of claim 7, wherein the transistor is a Gallium Nitride RF transistor and the output pre-match impedance conditioning shunt circuit is configured to compensate for a low drain-source capacitance.

11. The packaged RF amplifier device of claim 7, wherein the second inductance and the first capacitor form a series resonant circuit, which resonates at a resonant frequency in proximity to a center operating frequency of the RF amplifier.

12. A method of manufacturing a radio frequency (RF) amplifier device, the method comprising the steps of:
coupling a transistor to a RF amplifier device substrate, wherein the transistor includes a control terminal and first and second current carrying terminals;
coupling an output pre-match impedance conditioning shunt circuit to the RF amplifier device substrate between the first current carrying terminal and a ground reference node, wherein the output pre-match impedance conditioning shunt circuit includes a first inductance, a second inductance, and a first capacitor coupled in series, and wherein an RF cold point node is between the second inductance and the first capacitor;
coupling a plurality of bondwires between the first current carrying terminal and an intermediate node located between the first and second inductances, wherein the plurality of bondwires corresponds to the first inductance;

coupling one or more integrated inductors between the intermediate node and a first terminal of the first capacitor, wherein the one or more integrated inductors corresponds to the second inductance;

connecting a first terminal of a second capacitor to the intermediate node;

connecting a second terminal of the second capacitor to the ground reference node; and connecting a video bandwidth circuit between the RF cold point node and the ground reference node.

* * * * *